United States Patent
Kamata

(10) Patent No.: US 10,026,895 B2
(45) Date of Patent: Jul. 17, 2018

(54) SUPERLATTICE MEMORY AND CROSSPOINT MEMORY DEVICE

(71) Applicant: KABUSHIKI KAISHA TOSHIBA, Minato-ku, Tokyo (JP)

(72) Inventor: Yoshiki Kamata, Tokyo (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 0 days.

(21) Appl. No.: 15/427,525

(22) Filed: Feb. 8, 2017

(65) Prior Publication Data

US 2017/0229645 A1 Aug. 10, 2017

(30) Foreign Application Priority Data

Feb. 9, 2016 (JP) .................................. 2016-022989

(51) Int. Cl.
*H01L 45/00* (2006.01)
*H01L 27/24* (2006.01)

(52) U.S. Cl.
CPC ........ *H01L 45/144* (2013.01); *H01L 27/2481* (2013.01); *H01L 45/1233* (2013.01); *H01L 45/1253* (2013.01)

(58) Field of Classification Search
CPC ............. H01L 27/2463; H01L 27/2472; H01L 45/1233; H01L 45/144
See application file for complete search history.

(56) References Cited

U.S. PATENT DOCUMENTS

| 6,531,371 B2 * | 3/2003 | Hsu .................. G11C 11/15 257/E27.004 |
| 2015/0008385 A1 * | 1/2015 | Hidaka ................. H01L 45/144 257/2 |

FOREIGN PATENT DOCUMENTS

| JP | 2010-109175 A | 5/2010 |
| JP | 2010-183017 A | 8/2010 |
| JP | 2015-201519 A | 11/2015 |
| WO | WO-2010/090128 A1 | 8/2010 |

OTHER PUBLICATIONS

K. Shiraishi et al., "Physics in Charge Injection Induced On-Off Switching Mechanism of Oxide-Based Resistive Random Access Memory (ReRAM) and Superlattice GeTe/$Sb_2Te_3$ Phase Change Memory (PCM)," Extended Abstracts of the 2013 International Conference on Solid State Devices and Materials, Sep. 24-27, 2013, pp. 574-575.

* cited by examiner

*Primary Examiner* — Allison P Bernstein
(74) *Attorney, Agent, or Firm* — Foley & Lardner LLP

(57) ABSTRACT

According to one embodiment, a memory device includes a superlattice structure portion containing first chalcogen-compound layers and second chalcogen-compound layers differing in composition from the first chalcogen-compound layers are alternately deposited, a first layer provided on one of main surfaces of the superlattice structure portion in a deposition direction thereof, which has a larger energy gap than that of the superlattice structure portion, and a second layer provided on the other main surface of the superlattice structure portion in the deposition direction, which has a larger energy gap than that of the superlattice structure portion.

14 Claims, 5 Drawing Sheets

SUPERLATTICE MEMORY AND CROSSPOINT MEMORY DEVICE

CROSS-REFERENCE TO RELATED APPLICATIONS

This application is based upon and claims the benefit of priority from Japanese Patent Application No. 2016-022989, filed Feb. 9, 2016, the entire contents of which are incorporated herein by reference.

FIELD

Embodiments described herein relate generally to a superlattice memory device and a crosspoint memory device employing superlattice memory devices.

BACKGROUND

In recent years, attention has been paid to a superlattice memory cell having a layered crystal ($GeTe/Sb_2Te_3$) in which GeTe layers and $Sb_2Te_3$ layers are provided between two electrodes such that the GeTe layers alternate with the $Sb_2Te_3$ layers. The resistance value of this superlattice memory cell can be changed by movement of Ge in the layered crystal. Thus, switching can be performed with a low current, and a power consumption can be reduced, as compared with a phase-change memory cell.

However, a crosspoint memory device employing superlattice memory cells is required to further reduce its power consumption, since the number of the cells is large. In particular, it is required to further reduce the power consumption in a set (write)/reset (erasure) operation on a superlattice memory cell.

DETAILED DESCRIPTION

In general, according to one embodiment, a memory device comprises: a superlattice structure portion containing first chalcogen-compound layers and second chalcogen-compound layers differing in composition from the first chalcogen-compound layers are alternately deposited; a first layer provided on one of main surfaces of the superlattice structure portion in a deposition direction thereof, the first layer being a semiconductor or an insulator, which has a larger energy gap than that of the superlattice structure portion; and a second layer provided on the other main surface of the superlattice structure portion in the deposition direction, the second layer being a semiconductor or an insulator, which has a larger energy gap than that of the superlattice structure portion.

Crosspoint memory devices according to embodiments will be explained with reference to the accompanying drawings.

(First Embodiment)

Figure 1:
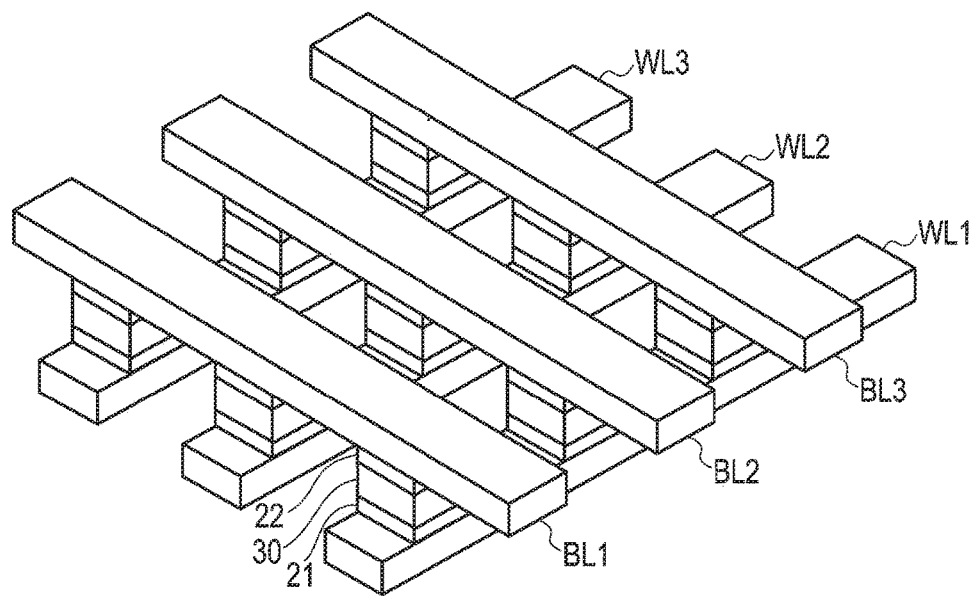
FIG. 1 is a perspective view illustrating a schematic configuration of a crosspoint memory device according to a first embodiment.
Figure 2:
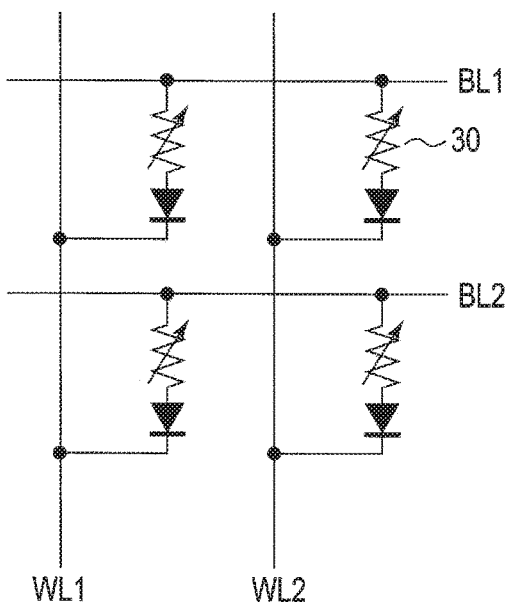
FIG. 2 is an equivalent circuit diagram view illustrating a circuit configuration of the crosspoint memory device according to the first embodiment.

FIGS. 1 and 2 are views for explaining a schematic structure of a crosspoint memory device according to the first embodiment; and FIG. 1 is a perspective view, and FIG. 2 is an equivalent circuit diagram.

A plurality of bit lines (first lines: BL [BL1, BL2, . . . ]) are arranged parallel to each other. A plurality of word lines (second lines: WL [WL1, WL2, . . . ]) are arranged parallel to each other and perpendicular to the bit lines BL. At intersections of the bit lines BL and word lines WL, superlattice memory cells 30 are provided in such a way as to be sandwiched between insulating films 21 and 22.

It should be noted that in FIG. 1, an interlayer insulating film, etc., are omitted in order that a structure be easily understood. Also, referring to FIG. 2, diodes for preventing erroneous selection are connected in series to superlattice memory cells 30; however, the diodes can be omitted.

Figure 3:
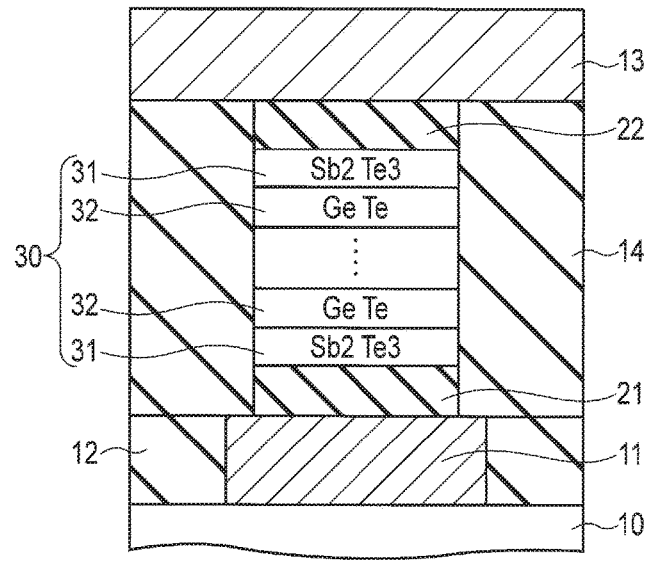
FIG. 3 is a cross-sectional view illustrating a device structure of a superlattice memory, which is applied to the crosspoint memory device as illustrated in FIG. 1.

FIG. 3 is a cross-sectional view illustrating a device structure of each of single memory portions.

In each memory portion, a lower electrode (first electrode) 11 is provided on a substrate 10. The lower electrode 11 forms a word line WL as provided as illustrated in FIG. 1, and extends in directions of the front and back of the drawing. Insulating films 12 formed of $SiO_2$ or the like are provided in space adjacent to sides of the lower electrode 11. It should be noted that the lower electrode 11 may be provided on the word line WL, not as the word line WL. Furthermore, the substrate 10 is, for example, a semiconductor substrate. In the semiconductor substrate, a CMOS circuit which writes data to a memory and reads data therefrom, etc., are provided.

On the lower electrode 11, a lower insulating film (first layer) 21, which is formed of $SiO_2$ or the like, is provided by a CVD method, sputtering or the like, and a superlattice memory cell 30 is provided on the lower insulating film 21.

On the superlattice memory cell 30, an upper insulating film (second layer) 22 formed of $SiO_2$ or the like is provided, and on the upper insulating film 22, an upper electrode (second electrode) 13 is provided. The upper electrode 13 forms a bit line BL provided as illustrated in FIG. 1, and extends rightwards and leftwards as illustrated in FIG. 3. It should be noted that the bit line BL may be provided on the upper electrode 13; that is, the upper electrode 13 does not always need to be provided as the bit line BL.

It should be noted that interlayer insulating films 14 formed of $SiO_2$ or the like are respectively provided in gaps between pillars each comprising insulating films 21 and 22 and a superlattice memory cell 30, such that surfaces of the interlayer insulating films and the pillars are flat. Further, the upper electrode 13 is provided to extend over the interlayer insulating film 14 in such a way as to connect upper surfaces of the superlattice memory cells 30.

In each single memory portion as illustrated in FIG. 3, the superlattice memory cells 30 each have a superlattice structure in which $Sb_2Te_3$ layers (first chalcogen-compound layers) 31 and GeTe layers (second chalcogen-compound layers) 32 are deposited by sputtering, the CVD method, an ALD method, an MBE method, or the like such that the $Sb_2Te_3$ layers 31 alternate with the GeTe layers 32. Further, lowermost and uppermost layers in the superlattice memory cell 30, which contact the insulating films 21 and 22, respectively, are the $Sb_2Te_3$ layers 31. However, the lowermost and uppermost layers in the superlattice memory cell 30 may be the GeTe layers 32. In addition, amorphous Si layers each having a thickness of approximately 0.1 to 10 nm may be interposed between the $Sb_2Te_3$ layers 31 and the GeTe layers 32 in order to improve the C axis orientation and crystallinity of superlattices. The total number of the $Sb_2Te_3$ layers 31 and the GeTe layers 32, which are deposited in the superlattice memory cell 30, can be changed as appropriate in accordance with specifications.

It should be noted that after formed by sputtering or the like, the insulating films 21 and 22, the $Sb_2Te_3$ layers 31 and the GeTe layers 32 are subjected to selective etching using a RIE method or the like, whereby they are processed and shaped in the form of a pillar.

In the superlattice memory cell 30, Ge atoms in a crystalline structure are moved by an applied voltage or current. This is a principle of operation of the superlattice memory cell 30. Furthermore, as compared with a phase-change memory cell formed of a phase-change material such as Ge2Sb2Te5, the superlattice memory cell 30 can perform switching with a low current. It is therefore advantageous in reduction of power consumption.

Figure 4:
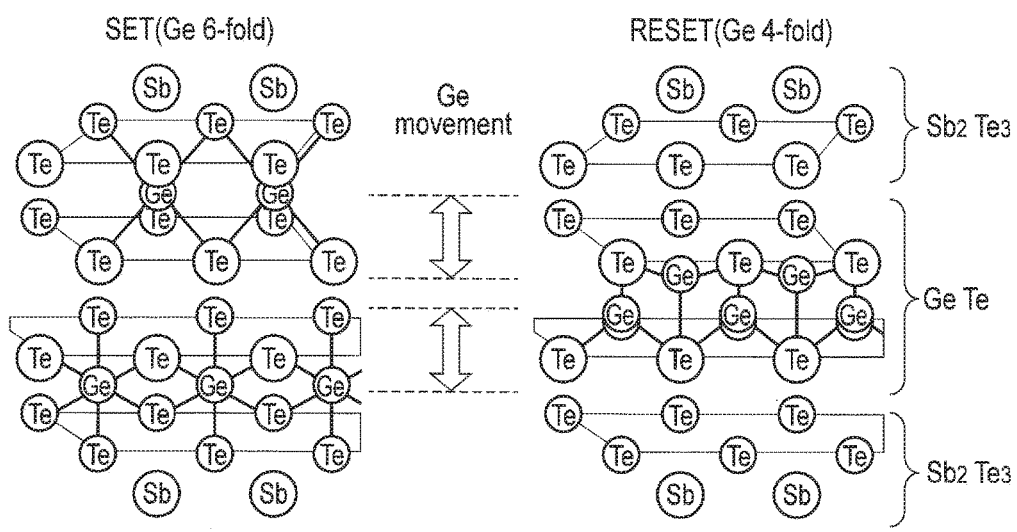
FIG. 4 is a diagram for explaining a set/reset operation in a superlattice memory cell.

As illustrated in FIG. 4, because of movement of Ge atoms, the superlattice memory cell 30 can be either in a write (set) state or an erasure (reset) state. More specifically, because of eclectic energy supplied to the superlattice memory cell 30, Ge atoms existing in a GeTe layer are diffused at the interface between the GeTe layer and an $Sb_2Te_3$ layer, thereby providing a structure whose state is equivalent to a crystallized state, as a crystal having anisotropy (write state). In this case, the electrical resistance of the provided structure is lower than that of a structure in which Ge atoms are still not diffused.

Also, using the electric energy supplied to the superlattice memory cell 30, by returning the Ge atoms accumulated at the interface into the above GeTe layer, it is possible to reduce the above provided structure to a structure similar to an amorphous structure and having an electrical resistance equivalent to that of a random structure conventionally called the amorphous structure (erasure state). In this case, the structure similar to the amorphous structure has a higher electrical resistance than that of the above provided structure.

In such a manner, by changing the electrical resistance because of movement of the Ge atoms in the crystalline structure, the memory device functions as a resistance-change memory.

In the first embodiment, between the superlattice memory cell 30 and the lower electrode 11, the lower insulating film 21 is interposed, and between the superlattice memory cell 30 and the upper electrode 13, the upper insulating film 22 is interposed. That is, the superlattice memory cell 30, which is located between the electrodes 11 and 13, is sandwiched between the insulating films 21 and 22.

It suffices that the thickness of each of the insulating films 21 and 22 is determined such that a parasitic resistance of the memory cell 30 is allowable, and it is preferable that the thickness be 2 nm or less. Also, it suffices that as the material of each of the insulating films 21 and 22, a film containing electrons and positive holes which have barriers ($\Delta Ec$, $\Delta Ev$) is applied. That is, each of these insulating films can be formed of $SiO_2$, SiN, AlN, $Al_2O_3$ or $GeO_2$, or a high-dielectric film (high-k film) such as $HfO_2$, $ZrO_2$ or $TiO_2$. Furthermore, the lower insulating film 21 and the upper insulating film 22 may be formed of different materials.

Next, a principle of the operation of the first embodiment will be further explained in detail with reference to FIGS. 5A, 5B, 6 and 7.

Figure 5A:
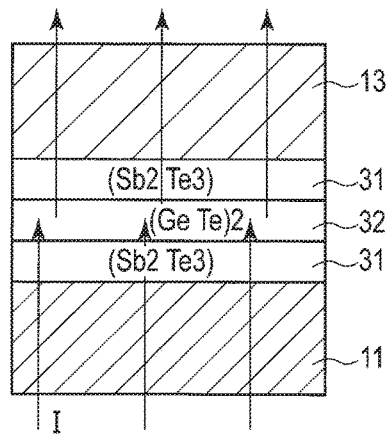
FIGS. 5A and 5B are diagrams for explaining the difference between a current path including insulating films and a current path including no insulating films.
Figure 5B:
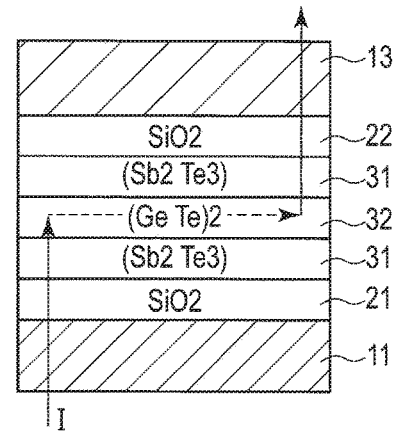
Figure 6:
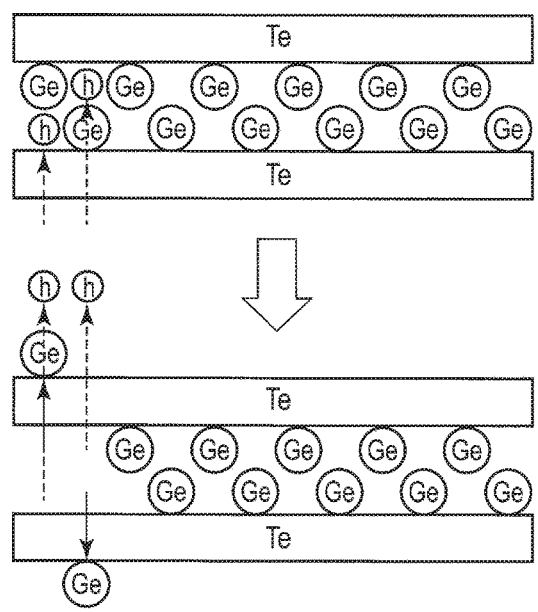
FIG. 6 is a diagram for explaining movement of Ge in a GeTe layer.
Figure 7:
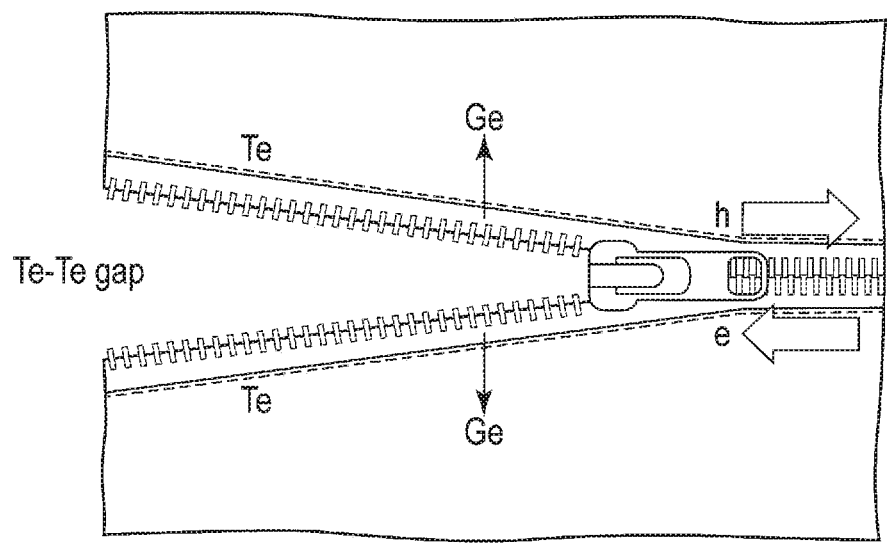
FIG. 7 is a diagram for explaining how a gap is formed by movement of Ge.

FIGS. 5A and 5B are diagrams for explaining the difference between a superlattice structure including insulating films and a superlattice structure including no insulating films. FIG. 5A illustrates a conventional superlattice structure including no insulating films, and FIG. 5B illustrates a superlattice structure according to the first embodiment, which includes the insulating films 21 and 22. FIG. 6 is a diagram illustrating movement of Ge in a GeTe layer; and FIG. 7 is a diagram illustrating how a gap is formed by movement of Ge.

In both the superlattice structures as illustrated in FIGS. 5A and 5B, when charge is injected thereinto, a charge distribution in a GeTe layer 32 varies, and Ge atoms move. That is, because of the charge injection, as illustrated in FIG. 6, Ge atoms move from the GeTe layer to the outside thereof, thus forming a Te—Te gap.

In the superlattice structure illustrated in FIG. 5A, charge relatively smoothly flows therein, and residence time for which the charge stays in the superlattice structure is short. By contrast, in the superlattice structure as illustrated in FIG. 5B, a quantum confinement effect is produced because of the presence of the insulating films 21 and 22, thus increasing the residence time for which the charge stays in the superlattice structure. Increasing of the residence time may be considered to mean that injected charge does not directly move toward an upper electrode 13; i.e., the charge moves as if it laterally did in the superlattice structure, and then moves toward the upper electrode 13.

To be more specific, although set/reset current flows from a lower electrode 11, and finally flows into the upper electrode 13, this flow is delayed by the insulating films 21 and 22, and thus takes longer time. As a result, since the residence time of charge is increased, Ge atoms further move. Also, because of the increase in the residence time of charge, as illustrated in FIG. 7, a Te—Te gap is opened/closed like a fastener by the charge, which is injected when the set/reset current flows. Therefore, the electrical resistance can be greatly changed with a small current.

In such a manner, according to the first embodiment, since the superlattice memory cell 30 is sandwiched between the insulating films 21 and 22, charge stays in the superlattice structure for a longer time, and current can be re-used in the GeTe layer 32. This means that the electrical resistance can be greatly changed with a small current. It is therefore possible to reduce the power consumption at the time of setting/resetting the superlattice memory cell 30. Accordingly, it is possible to reduce the power consumption of the crosspoint memory device, which employs superlattice memory cells 30.

As explained in the publication ("Physics in Charge Injection Induced On-Off Switching Mechanism of Oxide-Based Resistive Random Access Memory (ReRAM) and Superlattice GeTe/$Sb_2Te_3$ Phase Change Memory (PCM)", K. Shiraishi, M. Y. Yang, S. Kato et al., Extended Abstracts of the 2013 International Conference on Solid State Devices and Materials, Fukuoka, 2013, pp 574-575), memory cells have a higher resistance if electrons are injected into them, and have a lower resistance if positive holes are injected into them. Thus, it is preferable that a positive valence band offset ($\Delta Ev$) be present between insulating films 22 and memory cells on an anode side from which positive holes are moved. Similarly, it is preferable that a positive valence band offset ($\Delta Ec$) be present between insulating films 21 and memory cells on a cathode side from which electrons are moved.

In the first embodiment, the superlattice structure is not formed such that a single insulating film is provided only on one side of the superlattice memory cell 30; that is, it is formed such that two insulating films, i.e., the insulating films 21 and 22, are respectively provided on the both sides of the superlattice memory cell 30. Therefore, the above advantage can be obtained both at the time of setting the superlattice memory cell 30 and at the time of resetting the superlattice memory cell 30.

Furthermore, the superlattice structure of the first embodiment can be achieved simply by adding the insulating films 21 and 22, which are very thin, to a conventional superlattice structure. Thus, a slight increase in the thickness of the superlattice structure, which is caused by addition of the insulating films 21 and 22, gives rise to substantially no problem. In addition, addition of these insulating films does not require a specific process. Thus, the crosspoint memory device according to the first embodiment can be easily manufactured. This is also an advantage.

(Second Embodiment)

Figure 8:
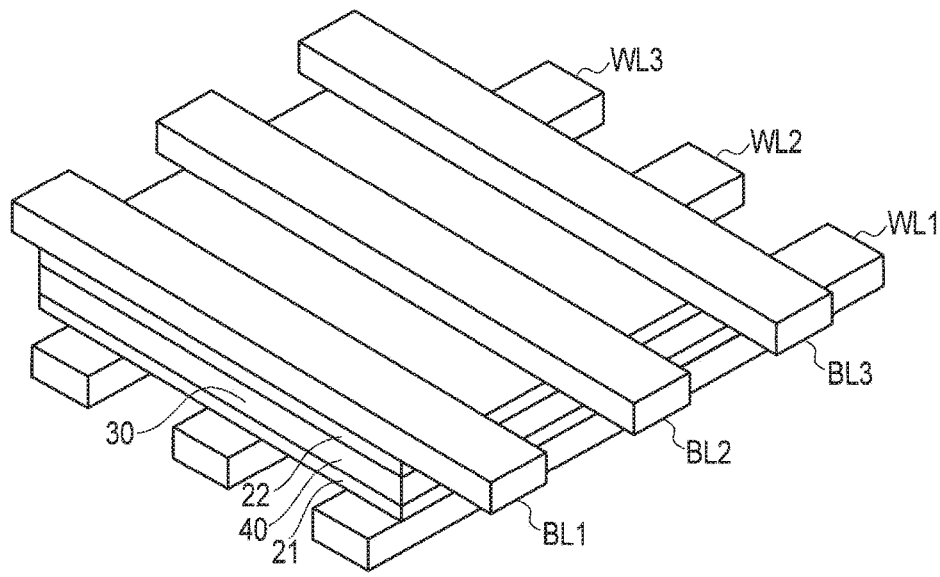
FIG. 8 is a perspective view illustrating a schematic configuration of a crosspoint memory device according to a second embodiment.
Figure 9:
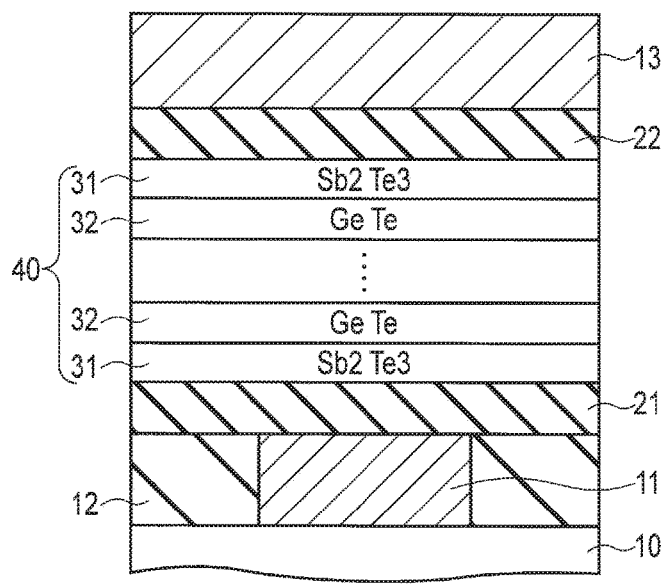
FIG. 9 is a cross-sectional view illustrating a device structure of a superlattice memory, which is applied to the crosspoint memory device as illustrated in FIG. 8.

FIGS. 8 and 9 are views for explaining a crosspoint memory device according to a second embodiment. FIG. 8 is a cross-sectional view illustrating a schematic structure of the crosspoint memory device, and FIG. 9 is a cross-sectional view illustrating an element structure of a superlattice memory. It should be noted that elements identical to those illustrated in FIGS. 1 and 3 will be respectively denoted by the same reference numbers as in FIGS. 1 and 3, and their detailed explanations will be omitted.

The second embodiment is different from the first embodiment as follows: unlike the first embodiment, $Sb_2Te_3$ layers 31 and GeTe layers 32 included in a superlattice memory cell 20 are not processed to be formed in the shape of a pillar. That is, in the second embodiment, $Sb_2Te_3$ layers 31 and GeTe layers 32 are formed to continuously extend in a plurality of superlattice memory cells 30. To be more specific, in a superlattice structure portion 40 comprising $Sb_2Te_3$ layers 31 and GeTe layers 32, although these layers are deposited by sputtering or the like, they are not etched by, for example, the RIE method. Also, insulating films 21 and 22 are formed by the same method as the $Sb_2Te_3$ layers 31 and GeTe layers 32; that is, they are not etched.

In such a structure, in the superlattice structure portion 40 comprising the $Sb_2Te_3$ layers 31 and the GeTe layers 32, regions located at intersections of bit lines BL and word lines WL substantially function as superlattice memory cells 30. That is, although the regions substantially functioning as the superlattice memory cells are located in the same structure portion, i.e., the superlattice structure portion 40, they can be electrically disconnected from each other, as long as they are not extremely close to each other; and they function in the same way as the superlattice memory cells in the equivalent circuit as illustrated in FIG. 2.

Therefore, according to the second embodiment, it is possible to manufacture a crosspoint memory device as in the first embodiment, and obtain the same advantages as the first embodiment. Furthermore, in the second embodiment, it is not necessary to perform processing for etching the superlattice structure portion 40 comprising the insulating films 21 and 22, the $Sb_2Te_3$ layer 31 and the GeTe layer 32, and the manufacturing process is thus simplified. This is also an advantage.

(Modification)

It should be noted that the present invention is not limited to each of the above-described embodiments.

In the embodiments, the first and second layers are insulating films formed of $SiO_2$, SiN or the like, however, they are not necessarily limited to the insulating films. They can be formed of semiconductor material. In order that charge be circulated and re-used in the superlattice structure, it is possible to use a semiconductor which has a larger energy gap than that of each of the $Sb_2Te_3$ layers in the superlattice structure. Also, it is possible to use a semiconductor which has a positive band discontinuous quantity ($\Delta EV$, $\Delta Ec$) with respect to at least one of a conduction band and a valence band of $Sb_2Te_3$.

Furthermore, the crystallinity of $Sb_2Te_3$ can also be improved by depositing $Al_2O_3$, $Bi_2Te_3$, $Sb_2Te_3$ and a superlattice. In this case, $Al_2O_3$ and $Bi_2Te_3$ deposited as lower layers function as the first layer according to the embodiments, and the same advantages as obtained by the embodiments can be obtained.

The layers forming the superlattice structure portion are not necessarily limited to $Sb_2Te_3$ layers and GeTe layers which are deposited. That is, in order to form the superlattice structure portion, it suffices that layered crystals each containing Ge and a chalcogen element and layered crystals each containing Sb and a chalcogen element are deposited. In other words, in order to form the superlattice structure portion, it suffices that first chalcogen-compound layers and second chalcogen-compound layers differing in composition from the first chalcogen-compound layers are deposited such that the first chalcogen-compound layers alternate with the second chalcogen-compound layers.

Furthermore, as the layers forming the superlattice structure portion, it is possible to use layers each formed of $(GeTe)n(Sb_2Te_3)m$; layers each formed of a compound obtained by substituting at least part of Ge of $(GeTe)n(Sb_2Te_3)m$ for C, Si, Sn or Pb; layers each formed of a compound obtained by substituting at least part of Sb of $(GeTe)n(Sb_2Te_3)m$ for Bi, As, P or N; or layers each formed of a compound obtained by substituting at least part of Te of $(GeTe)n(Sb_2Te_3)m$ for Se, S or O. That is, it is also possible to use a single crystal or a multicrystal of a homologous compound $[(AB)_n(C_2D_3)_m$, where A, B, C and D are elements, and n and m are numbers].

In addition, the arrangement of the superlattice memory cells is not necessarily limited to a two-dimensional arrangement. The superlattice memory cells can be three-dimensionally arranged to form a three-dimensional memory device. Furthermore, the structure of each of the memory cells is not necessarily limited to the superlattice structure. For example, the memory cells may be formed of a phase-change material such as $Ge_2Sb_2Te_5$.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory device comprising:
   a first electrode;
   a first insulating film provided on the first electrode;
   a superlattice structure portion containing first chalcogen-compound layers and second chalcogen-compound layers differing in composition from the first chalcogen-compound layers are alternately deposited, the superlattice structure portion provided on the first insulating film;
   a second insulating film provided on the superlattice structure portion; and
   a second electrode provided on the second insulating film,
   the first insulating film disposed between the first electrode and the superlattice structure portion,
   the second insulating film disposed between the second electrode and the superlattice structure portion.

2. The device of claim 1, wherein the first and second insulating films are $SiO_2$, SiN or AlN.

3. The device of claim 1, wherein the first chalcogen-compound layers are layered crystals each containing Sb, and the second chalcogen-compound layers are layered crystals each containing Ge.

4. The device of claim 1, wherein the first chalcogen-compound layers are $Sb_2Te_3$ layers, and the second chalcogen-compound layers are GeTe layers.

5. The device of claim 1, wherein the superlattice structure portion and the first and second insulating films are shaped in to a pillar.

6. The device of claim 5, wherein the superlattice structure portion and the first and second insulating films shaped into a pillar are provided in an interlayer insulating film.

7. The device of claim 1, further comprising an interlayer insulating film provided on sides of the first insulating film, the superlattice structure portion, and the second insulating film.

8. A memory device comprising:
   a plurality of first lines;
   a plurality of second lines extending in a direction crossing the first lines;
   superlattice memory cells respectively provided at intersections of the first lines and the second lines, the superlattice memory cells having superlattice structures containing first chalcogen-compound layers and second chalcogen-compound layers differing in composition from the first chalcogen-compound layers are alternately deposited;
   a first layer provided between one of main surfaces of each of the superlattice memory cells and one of the plurality of first lines and the plurality of second lines, the first layer being of a semiconductor or an insulator, which has a larger energy gap than that of the superlattice structure; and
   a second layer provided between the other main surface of the each superlattice memory cell and the other of the plurality of first lines and the plurality of second lines, the second layer being a semiconductor or an insulator, which has a larger energy gap than that of the superlattice structure,
   the one of main surfaces being a topmost main surface of each of the superlattice memory cells,
   the other of main surfaces being bottommost main surface of each of the superlattice memory cells.

9. The device of claim 8, wherein the first and second layers are each of $SiO_2$, SiN, AlN or a high-k film.

10. The device of claim 8, wherein the first chalcogen-compound layers are layered crystals each containing Sb, and the second chalcogen-compound layers are layered crystals each containing Ge.

11. The device of claim 8, wherein the first chalcogen-compound layers are $Sb_2Te_3$ layers, and the second chalcogen-compound layers are GeTe layers.

12. The device of claim 8, wherein the first chalcogen-compound layers, the second chalcogen-compound layers and the first and second layers are shaped in to a pillar.

13. The device of claim 8, wherein the first chalcogen-compound layers, the second chalcogen-compound layers and the first and second layers are provided to continuously extend in the superlattice memory cells.

14. The device of claim 8, further comprising an interlayer insulating film provided on sides of the superlattice memory cells, the first layer, and the second layer.

* * * * *